United States Patent
Imai et al.

[11] Patent Number: 6,026,228
[45] Date of Patent: Feb. 15, 2000

[54] INTEGRATED CIRCUIT DESIGN METHOD, DATABASE APPARATUS FOR DESIGNING INTEGRATED CIRCUIT AND INTEGRATED CIRCUIT DESIGN SUPPORT APPARATUS

[75] Inventors: Masaharu Imai, Takarazuka; Akichika Siomi, Hamamatsu; Yoshinori Takeuchi, Toyonaka; Jun Sato, Tsuruoka, all of Japan

[73] Assignee: Semiconductor Technology Academic Research Center, Tokyo, Japan

[21] Appl. No.: 08/989,425

[22] Filed: Dec. 12, 1997

[30] Foreign Application Priority Data

Dec. 13, 1996 [JP] Japan .................................. 8-333539

[51] Int. Cl.$^7$ ..................................................... G06F 17/50
[52] U.S. Cl. ................................. 395/500.19; 395/500.02
[58] Field of Search ........................ 395/500.02, 500.03, 395/500.04, 500.05, 500.06, 500.07, 500.09, 500.12, 500.13, 500.19

[56] References Cited

U.S. PATENT DOCUMENTS

| | | | |
|---|---|---|---|
| 5,487,018 | 1/1996 | Loos et al. ........................... | 395/500.12 |
| 5,499,192 | 3/1996 | Knapp et al. ............................ | 364/489 |
| 5,533,148 | 7/1996 | Sayah et al. ............................ | 382/240 |
| 5,544,066 | 8/1996 | Rostoker et al. ........................ | 364/489 |
| 5,557,531 | 9/1996 | Rostoker et al. ........................ | 364/489 |
| 5,557,532 | 9/1996 | Jun et al. ............................ | 395/500.19 |
| 5,566,079 | 10/1996 | Jun et al. ............................ | 395/500.19 |
| 5,610,833 | 3/1997 | Chang et al. ........................ | 395/500.12 |
| 5,764,532 | 6/1998 | Patel et al. ............................ | 395/500.1 |
| 5,802,349 | 9/1998 | Rigg et al. ........................... | 395/500.03 |
| 5,841,663 | 11/1998 | Sharma et al. .......................... | 364/490 |
| 5,870,308 | 2/1999 | Dangelo et al. ........................ | 364/489 |
| 5,953,519 | 9/1999 | Fura ..................................... | 395/500.19 |

*Primary Examiner*—Kevin J. Teska
*Assistant Examiner*—Leigh Marie Garbowski
*Attorney, Agent, or Firm*—McDermott, Will & Emery

[57] ABSTRACT

In a database, variety of modules which can be used as constituent elements of the object of design are registered as parametrized models, and instance generating information representing a procedure of generating instances and feature estimation information representing a method for estimating design features are stored every abstraction level for the various modules. A floorplan oriented design is executed by means of the database. That is, even at the higher level of the behavior or RT level, by means of the database, the design features of each module to be used for the design are estimated and the floorplan is executed. On the basis of the execution result, the design features of the circuit scale, delay time, power consumption and so forth of the object of design are estimated, and it is decided whether or not a design change is required.

19 Claims, 11 Drawing Sheets

Fig. 5

| MODEL CLASS | EXAMPLES |
|---|---|
| PROCESSOR | CPU, DSP |
| COMPUTATIONAL | FPU, DCT, FFT, ALU, BARREL SHIFTER, MULTIPLIER, DIVIDER |
| CONTROLLER | PROGRAMMABLE I/O CONTROLLER, INTERRUPT CONTROLLER, TIMER |
| STORAGE | REGISTER, REGISTER FILE, CACHE, RAM, ROM, QUEUE, STACK |
| COMMUNICATION | BUS, SIGNAL LINE |
| WIRE | CLOCK TREE, POWER LINE |
| PAD | I/O PAD |

Fig. 6

| CLASS | PARAMETER EXAMPLES | USAGE |
|---|---|---|
| ALL CLASSES | MODULE KIND | a |
| | INSTANCE NAME | a |
| | ABSTARACTION LEVEL | a |
| | CLOCK SCHEME | a |
| | I/O PORT COUNT | a |
| | AREA | a/r |
| | ASPECT RATIO | a/r |
| | POWER CONSUMPTION | a/r |
| | LOGIC VALUES | a |
| | COMMUNICATION PROTOCOL | r |
| PROCESSOR | PROCESSOR KIND | a |
| | INSTRUCTION SET | a |
| | REGISTER ORGANIZATION | a |
| | PIPELINE CONTROL INFORMATION | a |
| | EXECUTION CYCLES | a/r |
| COMPUTATIONAL | FUNCTION SET | a |
| | EXECUTION CYCLES | a/r |
| | COMPUTATION ALGORITHM | a/r |
| | INTERFACE | a |
| CONTROLLER | FUNCTION SET | a |
| | PROTOCOL | a |
| | CONTOROL ALGORITHM | a |
| STORAGE | MEMORY AMOUNT (DATA BIT WIDTH AND DEPTH) | a |
| | NUMBER OF BANKS | a |
| | NUMBER OF READ/WRITE PORTS | a |
| | MEMORY TYPE (S R A M, D R A M, R O M, etc.) | a |
| | ACCESS METHOD | a |
| COMMUNICATION | BIT WIDTH | a |
| WIRE | TRANSMISSION CAPABILITY, SKEW | a/r |
| PAD | NAME | a |
| | DRIVING CAPABILITY | a |

Fig. 7
| CLASS | PARAMETER EXAPLE | USAGE |
|---|---|---|
| I/O PORT | I/O PORT NAME | a |
| | I/O PORT LOCATION | a/r |
| | BIT WIDTH | a |
| | PORT TO PORT DELAY | a/r |
| | DRIVING CAPABILITY | a/r |
Fig. 8A
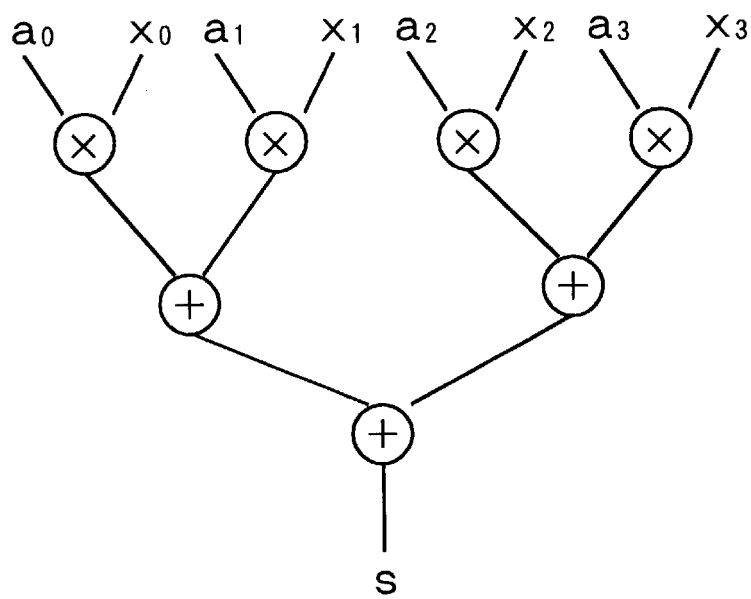
Fig. 8B
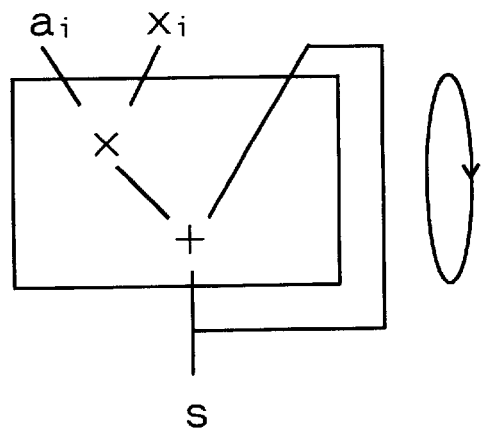

INTEGRATED CIRCUIT DESIGN METHOD, DATABASE APPARATUS FOR DESIGNING INTEGRATED CIRCUIT AND INTEGRATED CIRCUIT DESIGN SUPPORT APPARATUS

BACKGROUND OF THE INVENTION

The present invention relates to an integrated circuit design method, a database apparatus for implementing the design method and an integrated circuit design support apparatus provided with the database apparatus.

A conventional VLSI (Very Large Scale Integration) design method will be described with reference to FIG. 12. FIG. 12 is a flowchart showing an example of the conventional VLSI design method according to a top-down approach (this example referred to as "prior art" hereinafter).

In designing a VLSI, the designer firstly analyzes given design constraints, thereafter explores the architecture candidates (implementation approach), chooses the most promising one and then describes the chosen architecture by means of a hardware description language (referred to as an "HDL" hereinafter) (this description referred to as a "behavioral description" hereinafter). The thus-obtained behavioral description is a design result at the behavior level. As shown in FIG. 12(a), by subjecting this to a behavior level simulator or a verifier, the design at the behavior level is validated.

Subsequently, the designer generates a register transfer level (referred to as an "RT level" or "RTL" hereinafter) description obtained by describing an object of design at the RT level from the behavioral description (design at the RT level). The generation of the RTL description from the behavioral description is sometimes executed automatically by a behavioral synthesis tool. The generated RTL description is also a description in HDL. As shown in FIG. 12(b), by subjecting this to an RT level simulator or the like, the design at the RT level is validated. In this stage, hypothetical wire lengths are assumed for interconnections.

After the above validation, there is generated a net list (description of a logic circuit at a gate level) describing the object of design at the gate level from the RTL description by means of a logic synthesis tool. This net list is subjected to a logic simulator or the like as shown in FIG. 12(c), by which the design at the gate level is validated and a floorplan is thereafter executed. The floorplan for the net list is to roughly place and wire blocks constituting the logic circuit at the gate level.

Next, on the basis of the result of this floorplan, the design at the gate level represented by the net list is estimated. That is, a chip area, a signal delay time, a power consumption and so forth are estimated by means of the information of the placement of blocks and the wiring between blocks constituting the logic circuit, and it is decided whether or not the design constraints are satisfied. When it is decided that the design constraints are not satisfied, the net list is corrected for the design change at the gate level so that the design constraints are satisfied, and the corrected net list is subjected to the validation, floorplan and estimation similar to the above.

Thus, the processes of description change (design change by correcting the net list) →validation→floorplan→estimation are repeated at the gate level until the design at the gate level comes to satisfy the design constraints (see FIG. 12(c)). When it is decided that the design constraints are not satisfied through the processes, there is sometimes required a return to the higher level (RT level or behavior level) at need for a design change at the higher level. In this case, the designer firstly returns to the RT level to make a description so as to change the design for the satisfaction of the design constraints. However, upon deciding that no design change can cope with the constraints, the designer further returns to the behavior level so as to correct the description data at the behavior level for a design change.

When the design at the gate level comes to satisfy the design constraints, hypothetical placement and wiring corresponding to the net list are executed by means of a cell whose internal layout has been completed. By this operation, layout data (description at a layout level) representing a layout design is obtained, and the layout data is subjected to validation, floorplan and estimation. Through the validation at the layout level, it is checked whether or not a layout design is correctly executed by means of a circuit simulator, a DRC (Design Rule Checker) and so forth. Through the floorplan at the layout level, detailed placement and wiring are executed by the aforementioned cell. Then, on the basis of the results of the detailed placement and wiring, the chip area, delay time and power consumption are correctly estimated. After the confirmation that the design constraints are satisfied, it is decided whether or not there is anything to be improved among the design features represented by the chip area, delay time, power consumption and so forth. When there is anything to be improved or when it is discovered that the design constraints are not satisfied as a consequence of estimating the chip area, delay time, power consumption and so forth more correctly than in the case of the gate level on the basis of the layout data, the layout data is corrected in correspondence, and the corrected layout data is subjected to validation, floorplan and estimation.

As described above, the processes of description change (design change by correcting the layout data) →validation→floorplan→estimation are repeated at the gate level until the design features represented by the chip area, delay time, power consumption and so forth become satisfied (see FIG. 12(d)). When it is decided that the design constraints are not satisfied through the processes, there is sometimes a return to the higher level (gate level, RT level or behavior level) at need for a design change at the higher level.

When the design at the layout level comes to satisfy the design constraints, a mask pattern is generated from the layout data. Then, by means of a mask produced on the basis of this mask pattern, a VLSI is manufactured.

According to the aforementioned prior art design method, the precise delay time and power consumption are estimated by means of the wiring information obtained through the layout design. However, the influence of the wiring on the delay time and the power consumption has been not so significant in the integrated circuit according to the conventional semiconductor manufacturing technique. Therefore, it has scarcely occurred to discover the fact that the design constraints are not satisfied at the layout level and the consequent return to the higher level for a design change, meaning that such a design change has not been a serious problem.

However, when designing with a design rule on the order of 0.35 μm or 0.25 μm, or so-called the deep submicron order in accordance with the development of the semiconductor manufacturing technique, the aforementioned prior art design method cannot cope with the development. That is, in an integrated circuit fabricated by the deep submicron technique, a wiring delay becomes more dominant than a gate switching delay, and a wiring capacitance also becomes dominant in regard to the power consumption. As a result, neither the delay time nor the power consumption can be accurately estimated in the designing at the higher level, and as is often the case, this requires a return from the layout level to the gate level or the RT level for a design change or a return from the gate level to the RT level or the behavior level for a design change, possibly resulting in an actual failure in completing the design.

SUMMARY OF THE INVENTION

Accordingly, the object of the present invention is to provide an integrated circuit design method and an integrated circuit design support apparatus for the method capable of eliminating the aforementioned problems by accurately estimating the delay time, power consumption and so forth of an object of design at higher levels of design.

According to a first aspect of the invention, we provide an estimation method of an integrated circuit design on a top-down approach for designing at a behavior level an integrated circuit which is an object of design with specified constraints thereby generating a behavior level description data of the object of design and successively generating a description data corresponding to lower levels of abstraction from said behavior level description data, comprising the steps of:

preparing a database wherein a variety of modules capable of being used as constituent elements of the object of design are registered as parametrized models, and instance generating information representing a procedure for generating an instance which is a module implemented by giving a parameter value to each of the various modules and feature estimation information representing a method of estimating specified design features representing the features of the various modules are stored every abstraction level of said design on the top-down approach for the various modules;

generating a behavior level description data by generating instances by means of the instance generating information and the parameter values of the modules registered in said database and by describing at the behavior level the object of design with said instances used as constituent elements;

extracting from said database the feature estimation information of the modules described as the constituent elements of the object of design in said behavior level description data and estimating design features of the modules by means of said feature estimation information and said parameter values of the modules;

executing a floorplan corresponding to said behavior level description data on the basis of the design features of said modules; and estimating design features representing features of the design at the behavior level corresponding to said behavior level description data on the basis of a result of said floorplan.

According to a second aspect of the invention, we provide an estimation method of an integrated circuit design on a top-down approach for designing at a behavior level an integrated circuit which is an object of design with specified constraints thereby generating a behavior level description data of the object of design and successively generating description data corresponding to lower levels of abstraction from said behavior level description data, comprising the steps of:

preparing a database wherein a variety of modules capable of being used as constituent elements of the object of design are registered as parametrized models, and instance generating information representing a procedure for generating an instance which is a module implemented by giving a parameter value to each of the various modules and feature estimation information representing a method of estimating specified design features representing the features of the various modules are stored every abstraction level of said design on the top-down approach for the various modules;

generating a RTL description data which is a description data of the object of design at a register transfer level from said behavior level description data by means of the instance generating information at the register transfer level stored in said database;

extracting from said database the feature estimation information of the modules described as the constituent elements of the object of design in said RTL description data and estimating design features of the modules by means of said feature estimation information and said parameter values of the modules;

executing a floorplan corresponding to said RTL description data on the basis of the design features of said modules; and estimating design features representing features of the design at the register transfer level corresponding to said RTL description data on the basis of a result of said floorplan.

With the above estimation method according to the first or second aspect of the invention, design features of the modules serving as the constituent elements of the object of design are estimated at each level corresponding to the abstraction level of design, the floorplan is executed at the behavior level or both the behavior level and the RT level by means of the design features, and design features of the object of design are estimated on the basis of the result of the floorplan. For this reason, it is allowed to estimate the signal delay time, power consumption and so forth taking the wiring delay and the wiring capacitance into consideration at the higher levels of design, i.e., in early stages of design, and therefore, it can be correctly decided whether or not the design satisfies the constraints. Then, a shift from the design at the higher level to the design at the lower level will be made on the basis of this decision, and therefore, the possible occurrence of the requirement for a return from the lower level to the higher level for a design change can be prevented. When a module of the object of design has a hierarchical structure, it is preferable to execute the floorplan on the basis of connection information between submodules constituting the module and estimate the design features of the module having the aforementioned hierarchical structure by means of the execution result of the floorplan and the design features of the submodules. With this arrangement, the estimation accuracy of the design features of the module having a hierarchical structure can be improved.

According to a third aspect of the invention, we provide a database apparatus for use in executing a design on a top-down approach for designing at a behavior level an integrated circuit which is an object of design with specified constraints thereby generating a behavior level description data of the object of design and successively generating description data at lower levels of abstraction from said behavior level description data, comprising:

a storage means for storing therein a database in which a variety of modules capable of being used as constituent elements of the object of design are registered as parametrized models, and instance generating information representing a procedure for generating an instance which is a module implemented by giving a parameter value to each of the various modules and feature estimation information representing a method of estimating specified design features representing the features of the various modules are stored every abstraction level of said design on the top-down approach for the various modules;

an instance generating means for extracting an instance generating information of any of modules registered at an abstraction level in said database and for generating an instance for said module by means of said instance generating information and parameter values of said module, when said module and said abstraction level are designated and said parameter values are given; and a module feature estimating means for extracting a feature estimation information of any of modules registered at an abstraction level in said database and for estimating design features for said module by means of said feature estimation information and parameter values of said module, when said module and said abstraction level are designated and said parameter values are given.

With the above database apparatus according to the third aspect of the invention, it is allowed to generate at each abstraction level the instances of a variety of modules which can be used as the constituent elements of the object of design by the instance generating means and to estimate their design features by the module estimating means. Therefore, the floorplan oriented design described as above can be achieved by the integrated circuit design method according to the top-down approach. That is, even at the higher level such as the behavior level or the RT level, the floorplan can be executed by the design features of the module, thereby allowing the design features of the object of design to be estimated on the basis of the execution result. Furthermore, according to the database apparatus of the present invention, a variety of modules which can be used as the constituent elements of the object of design are registered as parametrized models in the database, and therefore, the modules have high reusabilities, consequently allowing the efficiency of the designing work to be improved.

According to a fourth aspect of the invention, we provide an integrated circuit design support apparatus operated by a designer for executing a design on a top-down approach for designing at a behavior level an integrated circuit which is an object of design with specified constraints thereby generating a behavior level description data of the object of design and successively generating description data at lower levels of abstraction from said behavior level description data, comprising:

the above database apparatus according to the fourth aspect of the invention;

a description data generating and editing means for generating and editing said behavior level description data by generating instances by means of said instance generating information and by describing at the behavior level the object of design with said instances used as constituent elements on the basis of an input operation conducted by said designer;

a floorplan executing means for obtaining design features of modules described as constituent elements of the object of design in said behavior level description data by a module feature estimating means by means of parameter values of the modules and executing a floorplan corresponding to said behavior level description data on the basis of said design features;

a design feature estimating means for estimating design features representing features of the design at the behavior level corresponding to said behavior level description data on the basis of a result of said floorplan; and a behavioral synthesis means for generating an RTL description data describing the object of design at a register transfer level from said behavior level description data describing the object of design at the behavior level by means of said instance generating information at the register transfer level stored in said database.

The above integrated circuit design support apparatus of the present invention is provided with the aforementioned database apparatus as well as a means at the behavior level or both the behavior level and the RT level for correcting the description data of the object of design, executing the floorplan, estimating the design features and executing synthesis for the generation of the description data at the lower level, and therefore, the aforementioned estimation method or integrated circuit design method can be implemented by this integrated circuit design support apparatus.

Other features and advantages of the present invention will become apparent from the following description of the invention which refers to the accompanying drawings.

BRIEF DESCRIPTION OF THE DRAWINGS

FIG. 5 shows the classes of FHM (Flexible Hardware Model) employed in the above database system;

FIG. 6 shows the parameters of FHM;

FIG. 7 shows the parameters of the I/O port of FHM;

FIGS. 8A and 8B are views showing data flow graphs expressing one implementation approach (Approach 1) and another (Approach 2) of an object of design at the behavior level;

DETAILED DESCRIPTION OF THE PREFERRED EMBODIMENTS

Outline of Integrated Circuit Design Method

Figure 1A:
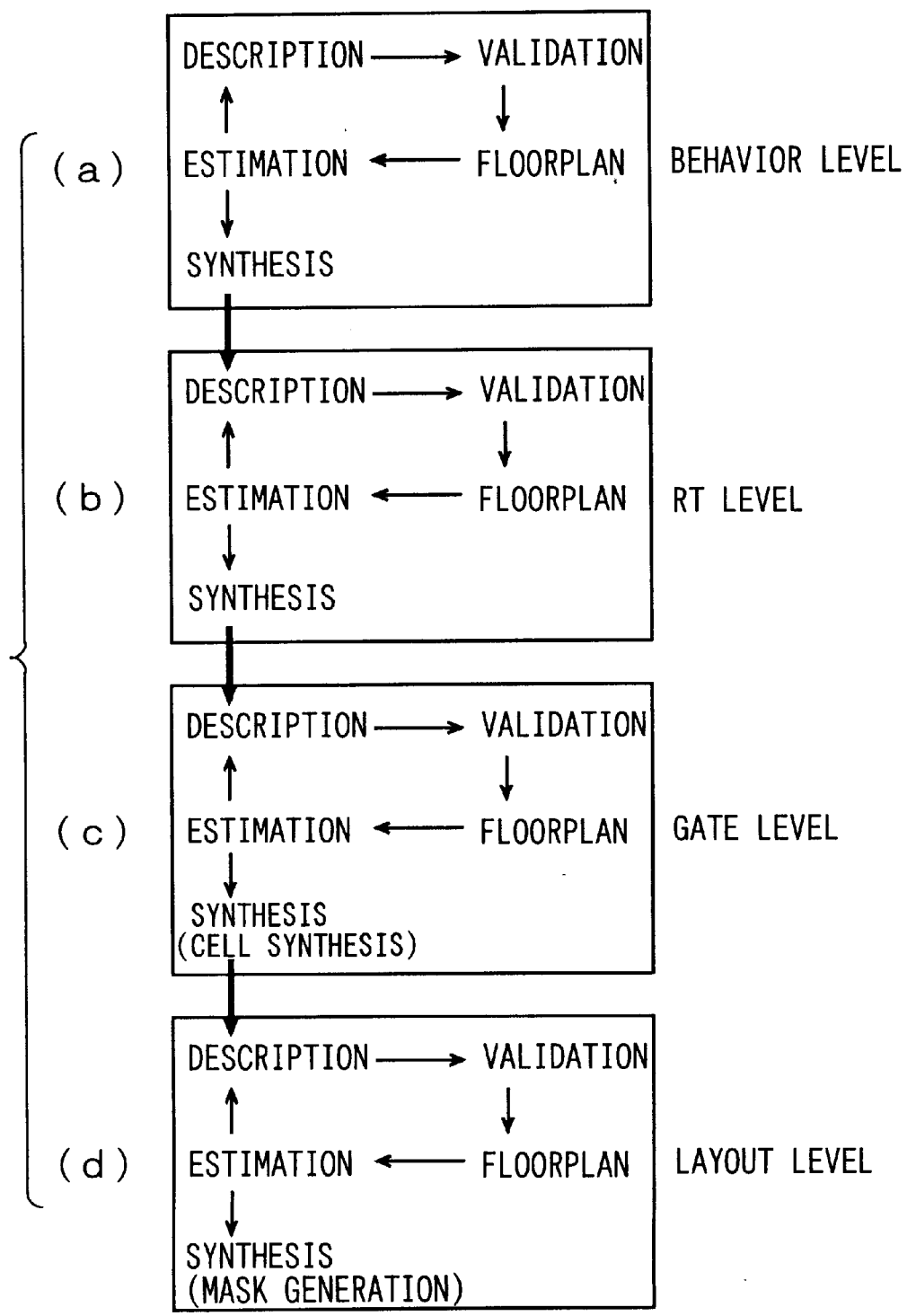
FIG. 1A is a flowchart showing an integrated circuit design method of the present invention.
Figure 1B:
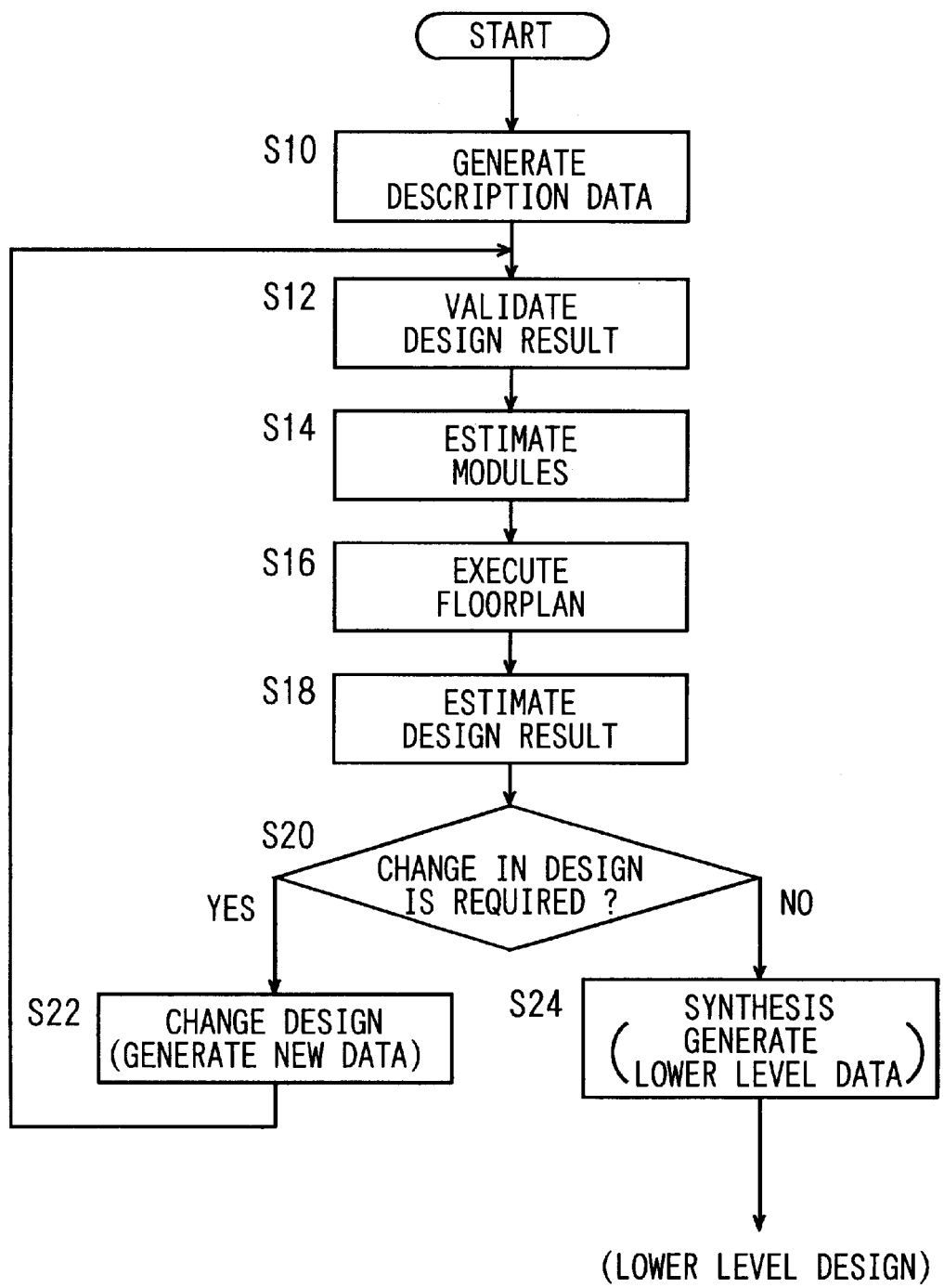
FIG. 1B is a detailed flowchart showing a design process at one abstraction level according to an integrated circuit design method of the present invention.

FIG. 1A is a flowchart showing an integrated circuit design method of the present invention. In this figure, the boxes indicated by the solid lines correspond to a behavior level, an RT level, a gate level and a layout level, representing the abstraction levels of design. FIG. 1B is a detailed flowchart showing a design process at one of the abstraction levels according to the present design method. The present design method is for designing a VLSI on a top-down approach similar to the prior art shown in FIG. 12, however, it differs from the prior art in that a floorplan and an estimation of the design based on it are executed both at the behavior level and the RT level. That is, even at the behavior level and the RT level, features representing the design qualities of a chip area, a signal delay time, a power consumption and so forth (referred to as "design features" hereinafter) are calculated for the estimation of the design, and the processes of the description change of an object of design→validation→floorplan→estimation are repeated until no design change is required at each level. This placement allows the design features to be accurately estimated at a higher level as much as possible, thereby obviating the need for a return from the lower level to the higher level for a design change.

Total Construction of Integrated Circuit Design Support Apparatus

An integrated circuit design support apparatus according to an embodiment of the present invention, i.e., an integrated circuit design support apparatus for use in implementing the aforementioned integrated circuit design method will be described below.

Figure 2:
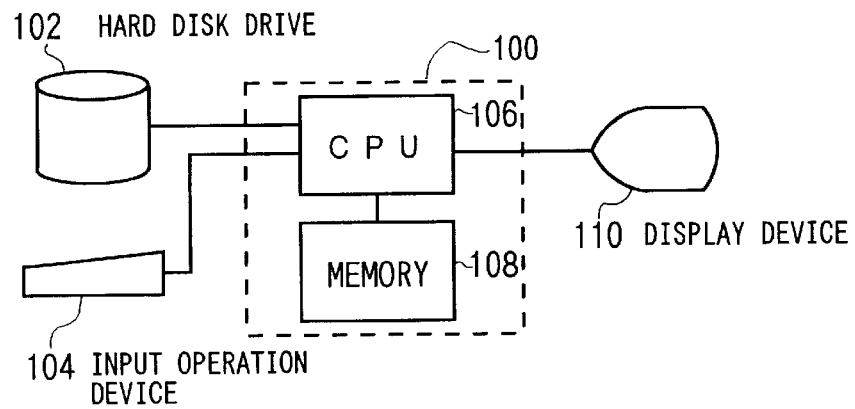
FIG. 2 is a schematic block diagram showing the hardware construction of an integrated circuit design support apparatus of the present invention.

FIG. 2 is a schematic block diagram showing the hardware construction of the present integrated circuit design support apparatus. The hardware of the present integrated circuit design support apparatus is a computer system such as a work station constructed of a main body 100 having a CPU 106 and a memory 108, a hard disk drive 102, an input operation device 104 such as a keyboard and a mouse pointer and a display device 110 such as a CRT display. Then, the CPU 106 executes a specified program stored in the memory 108, so that a variety of functions for supporting the design of an integrated circuit on the top-down approach are realized.

Figure 3:
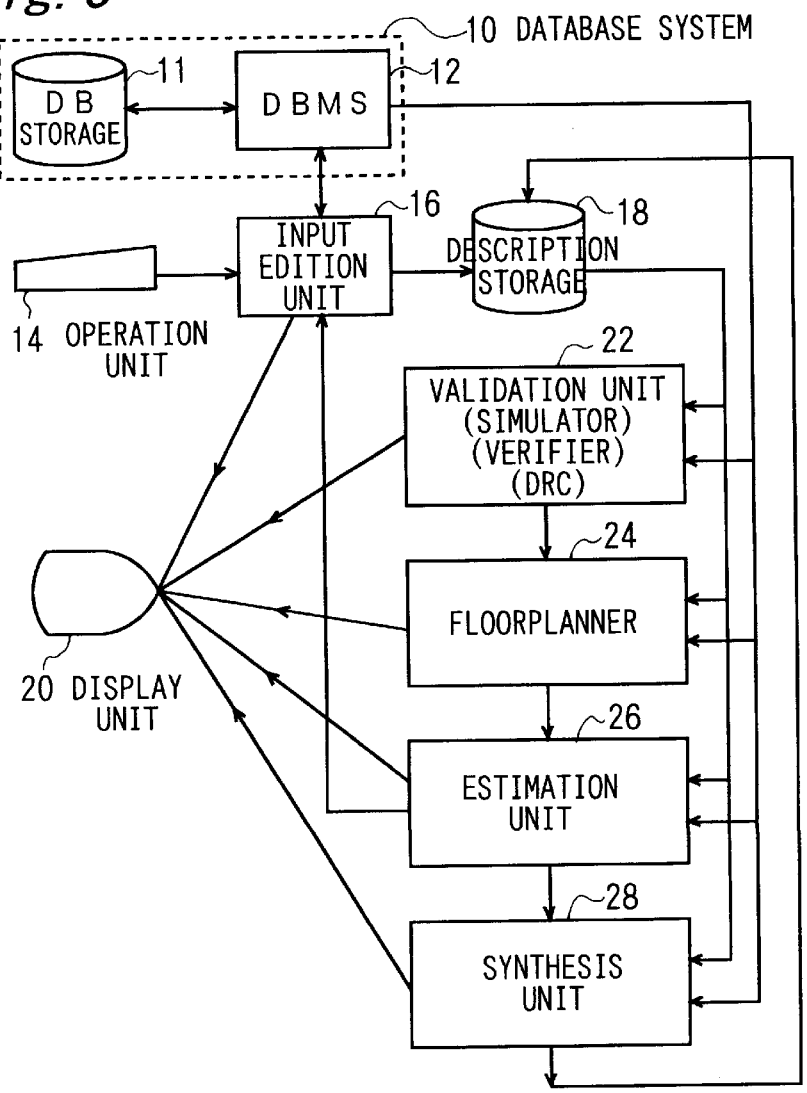
FIG. 3 is a functional block diagram showing the construction of the integrated circuit design support apparatus of the present invention.

FIG. 3 is a functional block diagram schematically showing the construction of the present integrated circuit design support apparatus. As shown in this figure, in conception the present integrated circuit design support apparatus is constructed of a DB storage 11 which stores therein a database based on FHM (Flexible Hardware Model) as described later, a database administrator system (referred to as a "DBMS" hereinafter) 12 for the FHM-DB, an operation unit 14, an input edition unit 16, a description storage 18 which stores therein description data obtained by describing the object of design at each level, a validation unit 22, a floorplanner 24, an estimation unit 26, a synthesis unit 28 and a display unit 20. Among these, the operation unit 14 and the display unit 20 correspond respectively to the input operation device 104 and the display device 110 shown in FIG. 2, and the DB storage 11 and the description storage 18 are provided by the hard disk drive 102. The other constituent elements shown in the functional block diagram of FIG. 3 are provided by the specified program stored in the memory 108.

In the integrated circuit design support apparatus constructed as above, the DB storage 11 in which the FHM-DB is stored and the DBMS 12 constitute a database system 10 for the integrated circuit design (described in detail later). In the FHM-DB is registered a variety of modules which can be used as the constituent elements of the integrated circuit of the object of design, and the DBMS 12 provides functions for executing extraction of information relevant to the registered module, registration of a new module into the FHM-DB and so forth.

The input edition unit 16 generates a description data for describing the object of design, stores the same into the description storage 18 and executes the edition processes of effecting a change, addition and so forth on the description data stored in the description storage 18 on the basis of an input operation at the operation unit 14 conducted by the designer. The description data to be an object of edition is description data at each abstraction level obtained in each step of the top-down design, i.e., data describing the object of design at the behavior level, RT level, gate level and layout level.

The validation unit 22 validates the design at each of the aforementioned levels by using the aforementioned description data at each of the aforementioned levels. For this purpose, the validation unit 22 is provided with a simulator for executing a simulation of the behavior of the object of design at each of the aforementioned levels, a verifier for verifying the design results at each of the aforementioned levels represented by the description data through a mathematical analysis and so forth. The validation unit 22 further includes the function of executing DRC (Design Rule Checking) for the validation of the design at the layout level.

The floorplanner 24 executes placement and wiring between modules which are the constituent elements of the object of design at each of the aforementioned levels (execution of floorplan).

The estimation unit 26 estimates the design features of the whole object of design by means of the design features of the modules which are the constituent elements of the object of design at each of the aforementioned levels and the information of the placement and wiring obtained by executing the floorplan at each of the aforementioned levels. This enables the estimation of the design at each of the aforementioned levels. According to the design features of the whole object of design and design constraints, it is decided whether or not a change is required in the current stage of design, i.e., whether or not a correction of the description data of the object of design is required at the level corresponding to the current stage (referred to as a "current level" hereinafter). This decision may be made by the estimation unit 26. Alternatively, it is acceptable to display an estimation result (estimation result of design) by the estimation unit 26 on the display unit 20 and let the designer decide whether or not the description data at the current level is to be corrected by referring to the result.

The synthesis unit 28 generates description data at a level one level lower than the current level from the description data at the current level when it is decided that any correction of the description data at the current level (design change at the current level) is not required and then stores the data into the description storage 18. When it is decided that the description data at the current level is required to be corrected, the synthesis unit 28 does not generate any description data at the lower level. In this case, the designer corrects the description data at the current level by means of the operation unit 14 and the input edition unit 16.

It is to be noted that the display unit 20 displays the estimation result of the design at each level as stated before as well as processing results at the input edition unit 16, validation unit 22, floorplanner 24 and synthesis unit 28, and the designer can execute the required operation of correction of the description data and so forth by referring to them.

Construction and Operation of Database System for
use in Integrated Circuit Design The database system 10 which comprises the DB storage 11 storing the FHM-DB and the DBMS 12 will be described next.

Figure 4:
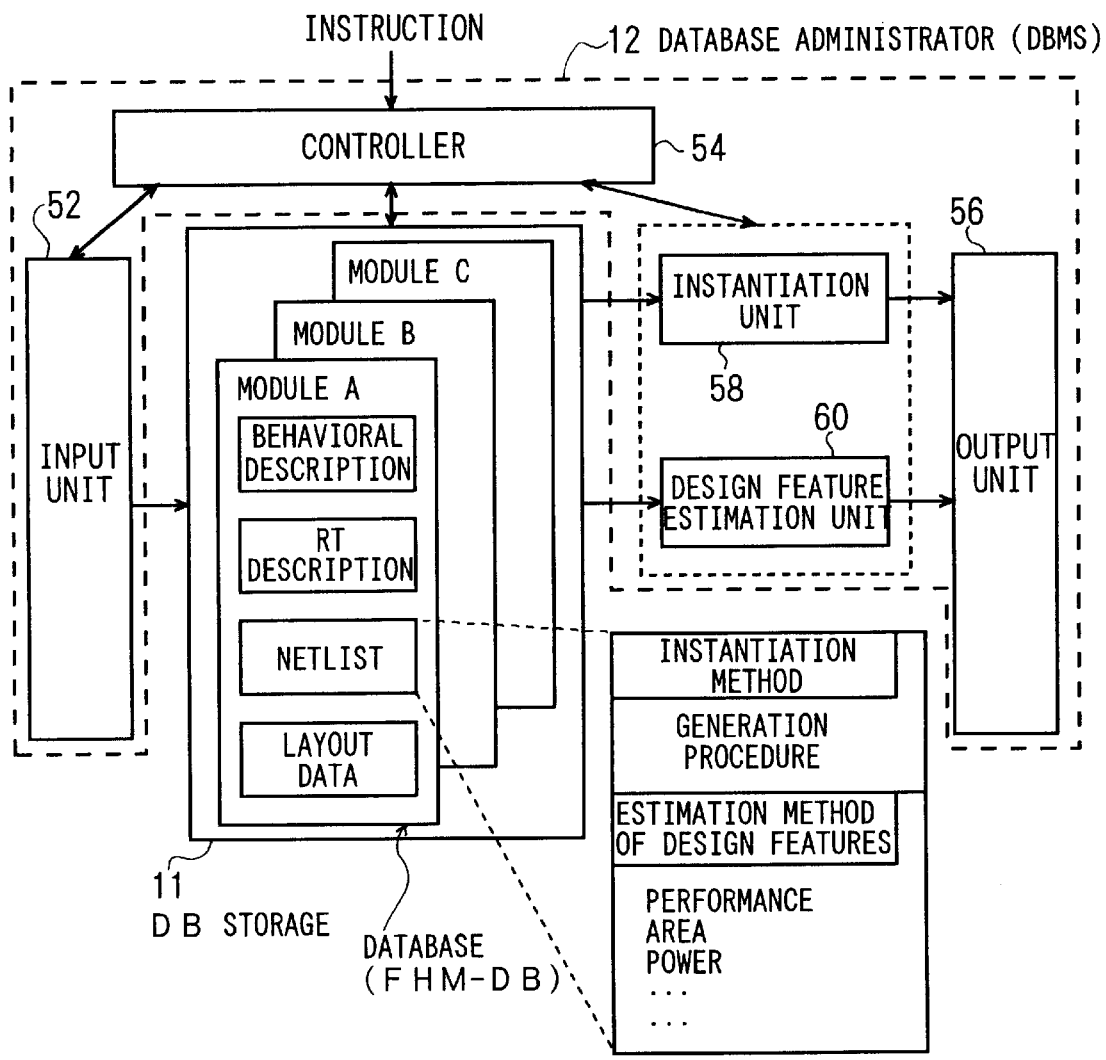
FIG. 4 is a functional block diagram showing the construction of a database system employed in the above integrated circuit design support apparatus.

FIG. 4 is a functional block diagram showing a detailed construction of this database system 10. In the database (FHM-DB) of this database system 10 is stored a variety of modules which can be used as the constituent elements of the object of design as a model having the following features.

(1) The model is parametrized, and an instance which is a module implemented as the constituent elements of individual object of design can be generated by giving a parameter value to the parametrized model.

(2) Instances having different abstraction levels can be generated from one model.

(3) Before the instance generation, design features can be estimated by means of the characteristics of the model.

The model having the above-mentioned features (1), (2) and (3) are referred to as FHM (Flexible Hardware Model) herein. For the purpose of realizing a database in which a variety of modules of FHM are registered as described above, information representing an instance generating method (referred to as an "instance generating information" hereinafter) and information representing a method of estimating design features (referred to as a "feature estimating information" hereinafter) are stored in the DB storage 11 at each of the abstraction levels of the behavior level, RT level, gate level and layout level for each registered module. That is, in the FHM-DB are described at each of abstraction levels (every level) for each registered module a procedure for generating an instance by means of the parameter values of the module and the estimating method for estimating the design features by means of the parameter values of the module.

The various models of FHM can be classified into several classes of a processor, a computational module, a control module, a storage module, a communication module, a wire module and a pad module as shown in FIG. 5. Then, as shown in FIG. 6, in regard to the parameters of FHM, some of them are common to all the classes, and the other parameters are inherent to the respective classes. In FIG. 6, the parameters whose usage is designated as "a" are those whose values are given to the model in instance generation and design feature estimation. The parameters whose usage is designated as "a/r" are those whose values are given to the model in instance generation and design feature estimation and are obtained as an estimation value. The parameters whose usage is designated as "r" are those whose values are obtained as an estimation value by design feature estimation or the like. The I/O port, which corresponds to the module terminal, exists in all the modules. This is provided as an independent class and is made to have, for example, parameters as shown in FIG. 7 as its own attribute. That is, the class of I/O port has information relevant to the module terminal in the form of parameters. In regard to the parameters shown in FIGS. 6 and 7, no hierarchical classification corresponding to each design level is performed, and parameters required at each design level (behavior level to layout level) are enumerated. For this reason, among the parameters enumerated herein are included those which are not used from the viewpoint of each level.

The database administrator (DBMS) 12 is constructed of an input unit 52, a controller 54, an instantiation unit 58, a design feature estimation unit 60 and an output unit 56 as shown in FIG. 4, and this operates under the control of the controller 54 on the basis of instructions given to the DBMS 12.

For example, an instruction of newly registering a module defined by the designer (the module referred to as a "user definition module" hereinafter) is given to the DBMS 12, the input unit 52 is activated by the controller 54. Then, information relevant to the user definition module is inputted by the input unit 52 and stored into the DB storage 11, so that the user definition module is registered.

Further, for example, when an instruction of estimating the design features of a register file which is a module at the RT level is given together with parameter values to the DBMS 12, the design feature estimation unit 60 is activated by the controller 54. Then, the design feature estimation unit 60 refers to feature estimation information at the RT level of the register file and estimates the design features representing the delay time, area, power consumption and so forth of the register file at the RT level by means of the information and the parameters given with the aforementioned instruction. For example, a hardware size (area or gate count) S in the case of the register file is estimated according to the following equation with a bit width B and a word count W used as parameters.

$$S = k1 \cdot B \cdot W + k2 \cdot W \cdot \log(W) + k3$$

where k1, k2 and k3 are coefficients, and the values of these coefficients and the information representing the aforementioned estimation equations are stored as feature estimation information for the register file in the DB storage 11.

The design features thus estimated by the design feature estimation unit 60 are outputted from the DBMS 12 by the output unit 56.

Further, for example, when an instruction of generating an instance of the processor at the behavior level is given with parameter values to the DBMS 12, the instantiation unit 58 is activated by the controller 54. Then, the instantiation unit 58 refers to the information (instance generating information) in the FHM-DB representing the procedure of generating the instance of the processor module at the behavior level and generates the instance of the processor at the behavior level by means of the instance generating information and the parameter values given with the aforementioned instruction. Data representing the generated instance, i.e., data describing the processor module implemented by the aforementioned parameter values at the behavior level is outputted from the DBMS 12 by the output unit 56. In addition to the instance generation thus executed by the instantiation unit 58, the design feature estimation unit 60 refers to the feature estimation information of the processor module at the behavior level and also estimates the design features (area, execution cycles etc.) of the processor module implemented as the instance based on the information. Therefore, when the instruction of the instance generation described as above is issued, in addition to the data describing the processor implemented as the instance of the design at the behavior level, information representing the design features of the implemented processor is also obtained from the DBMS 12.

The design features estimated for each module registered in the FHM-DB can be used as features for estimating the quality of the module, and they can be represented as a vector whose elements are an ordered set of lower bound, typical value and upper bound. That is, they can be expressed as follows:

Design Feature=(Area, Delay Time, Execution Cycles, Power Consumption, . . . ) (1) where

| | | |
|---|---|---|
| Area = | (Alb, Atyp, Aub) | (2) |
| Delay Time = | (Dlb, Dtyp, Dub) | (3) |
| Execution Cycles = | (Clb, Ctyp, Cub) | (4) |
| Power Consumption = | (Plb, Ptyp, Pub) | (5) |
| ... | | |

In the above expressions, the "delay time" and the "execution cycle" denote the performance of the module that is the object of estimation.

On the basis of the above modeling of the design features to be estimated, the design feature estimation unit 60 estimates one or both of a range defined by the aforementioned lower bound (e.g., Alb) and the upper bound (e.g., Aub), and the typical value (e.g., Atyp). In this case, the typical value can be used as a reference in the design, which normally reflects a default implementation of the module.

In general, as the abstraction level of design becomes higher, it becomes more difficult to estimate the design features accurately. Therefore, the design feature estimation unit 60 executes the estimation so that the aforementioned range of the design features is wide at the higher level and the aforementioned range of the design features is narrow at the lower level. Accordingly, in the stage of instance generation at the layout level, or the lowest level, the design features are estimated most accurately.

In regard to the aforementioned user definition module, when it has a hierarchical structure and there is no feature estimation information of the user definition module at the time point when it is registered, the design features are estimated according to a procedure comprised of the following steps 1 through 3 (it is assumed that the user definition module is denoted by M in the following steps).

(Step 1): Determine a floorplan of the module M on the basis of interconnection information between submodules M1, M2, . . . , Mn of the module M.

(Step 2): Estimate design features of the module M by means of the above-mentioned floorplan and the design features of the submodules M1, M2, . . . , Mn.

(Step 3): When the feature estimation information of the submodules M1, M2, . . . , Mn is not existing in the FHM-DB, estimate the design features of the module M by recursively applying the present procedure to the submodules Mi (i=1, . . . , n) until the feature estimation information can be obtained. Even when the feature estimation information of the submodules can be obtained allowing the design features of the module M to be estimated, it is acceptable to recursively execute the present procedure until the design features come to satisfy specified restrictive conditions (until the more precise design features can be obtained).

It is preferable to form the feature estimation information of the user definition module on the basis of the estimated design features of the user definition module according to the aforementioned procedure and to store the formed information in the FHM-DB. By this operation, the design features of this user definition module will be able to be estimated without executing the aforementioned procedure in the subsequent stages.

EXAMPLE OF INTEGRATED CIRCUIT DESIGN

An example in which the design method shown in FIGS. 1A and 1B is applied to a concrete object of design will be described below with reference to the operation of the integrated circuit design support apparatus having the aforementioned construction shown in FIGS. 3 and 4.

1. Object of Design and Design Constraints

Hardware implemented as an integrated circuit for executing a product-sum operation expressed by the following numerical expression (the hardware referred to as a "product-sum circuit" hereinafter) is used as an object of design. It is to be noted that the design of a data input/output portion of this product-sum circuit is not regarded as the object for simplicity of explanation.

$$S=\Sigma(i=0,3)(a_i \cdot x_i) \qquad (6)$$

where "Σ" is the symbol of the summation and "Σ(i=n1,n2)" means a summation from i=n1 to i=n2 in regard to the subsequent term.

It is assumed that the following conditions are given as design constraints.

(1) Operating frequency: 10 [MHz] or higher (2) Operation time: 400 [ns] or lower (3) Circuit scale: 5000 [gates] or less The condition of hardware cost is often expressed as a condition for the chip area, however, the condition of hardware cost is herein expressed by the condition of gate count corresponding to the circuit scale as in the above item (3) for simplicity of explanation.

2. Implementation Approach

As a approach for implementing the aforementioned product-sum circuit of the object of design, the following two implementation approaches are selected as candidates, and it is assumed that a variety of modules required for the implementation approaches are registered in the FHM-DB.

(Approach 1): Implementation is achieved by a hardware construction corresponding to the following equation (7):

$$s=a_0 \cdot x_0 + a_1 \cdot x_1 + a_2 \cdot x_2 + a_3 \cdot x_3 \qquad (7)$$

(Approach 2): Implementation is achieved by a hardware construction corresponding to the description of the following operation procedure:

s=0;

for i=0 to 3

$$s=a_i \cdot x_i + s;$$

3. Design Procedure

<3.1 Behavior level (FIG. 1A (*a*))>

The designer firstly analyzes the aforementioned design constraints, thereafter selects any one of the candidates for the aforementioned two implementation approaches and executes a design at the behavior level for the implementation of the object of design by the selected approach. The following statement is made on the assumption that the designer firstly adopts the Approach 1. In this case, the designer draws a data flow graph as shown in FIG. 8A representing the construction of the object of design at the behavior level according to the Approach 1 and describes this data flow graph by means of a specified hardware description language (HDL). This description is made by the designer operating the operation unit 14, and the input edition unit 16 generates description data at the behavior level on the basis of this operation and stores it into the description storage 18 (step S10 in FIG. 1B). This description data, which is obtained by describing the object of design at the behavior level, can be considered as a design result at the behavior level. As apparent from FIG. 8A, this design requires four multipliers and three adders. There is further required a controller for controlling the operations of these multipliers and adders. Therefore, instances of the modules of the multiplier, adder and controller are generated by the DBMS 12 in the description at the behavior level, and the description of the object of design is constituted by these instances. In this instance generating stage, the bit widths of the multiplier and the adder are given as the parameter values to the DBMS 12. Further, in this stage, the following information can be obtained as design features of the multiplier, adder and controller.

(1) Adder: Circuit scale: 327 to 626 [gates]
   Delay time: 6.19 to 57.4 [ns]
(2) Multiplier: Circuit scale: 2738 [gates]
   Delay time: 54.97 [ns]
(3) Controller: Circuit scale: 10 to 12 [gates]

When the description data at the behavior level is obtained as described above, then the design result at the behavior level is validated by the validation unit 22 by means of this description data (step S12 in FIG. 1B). In this stage, the validation unit 22 executes a functional validation by subjecting the description data at the behavior level to the behavior level simulator or the verifier.

Figure 9A:
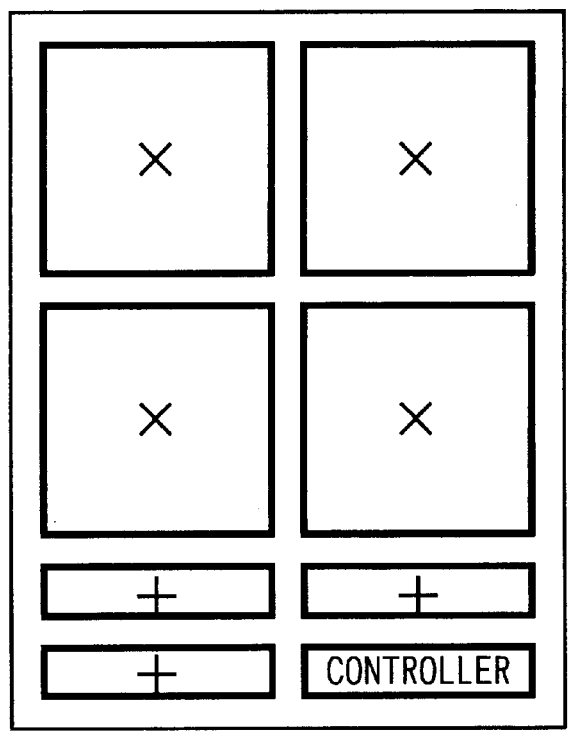
FIGS. 9A and 9B are views showing the results of a floorplan at the behavior level in the above embodiment.
Figure 10:
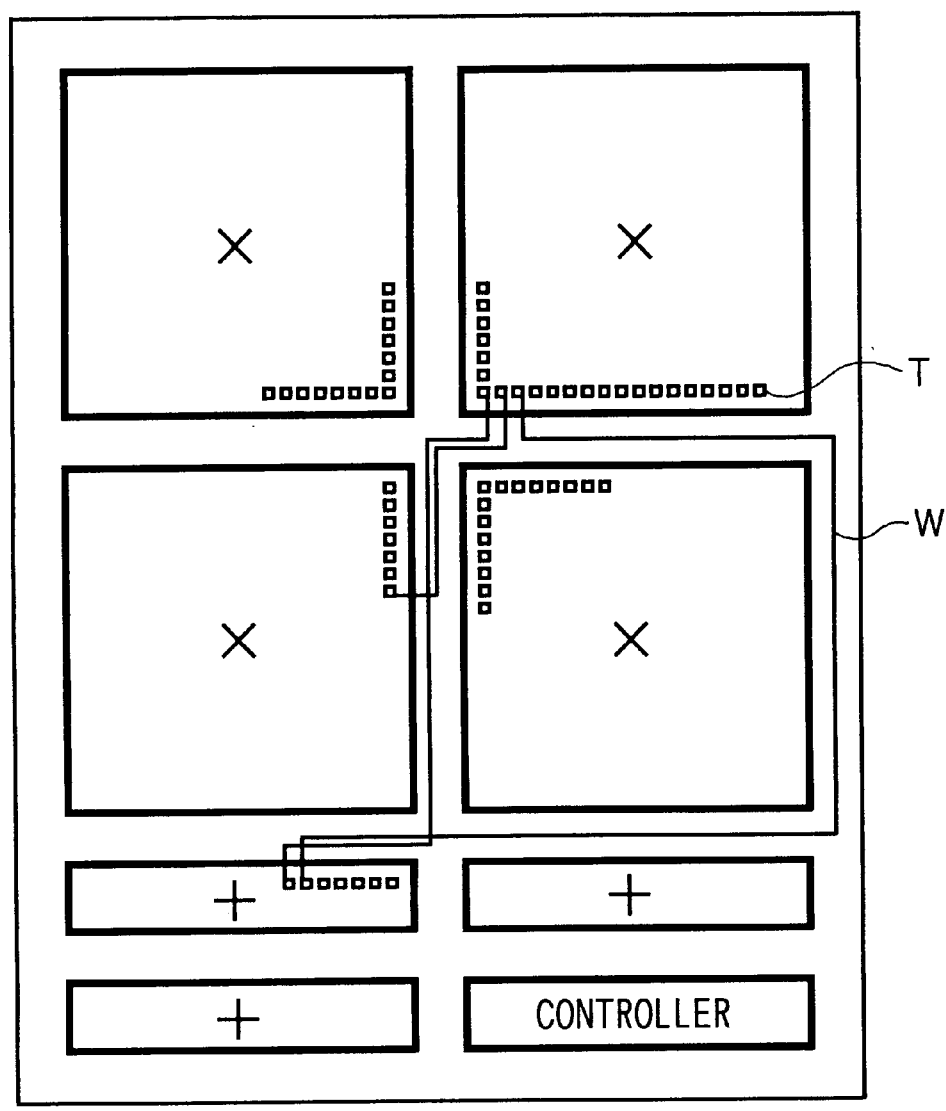
FIG. 10 is a view showing a state in which wiring between modules is being carried out according to the floorplan at the behavior level in the above embodiment.

After the above validation, a floorplan is executed at the behavior level by the floorplanner 24 (step S16 in FIG. 1B). That is, the floorplanner 24 executes the placement of the modules (instances) implemented at the behavior level and wiring between those modules of the aforementioned multipliers, adders and controller on the basis of the description data at the behavior level. By this operation, a floorplan result as shown in FIG. 9A is obtained (note that the wiring between the modules is not shown). In executing the floorplan, information relevant to the terminals of the modules of the aforementioned multipliers, adders and controller are required for the wiring between the modules. Since the terminals of all the modules are modeled as I/O ports as stated before (see FIG. 7), information relevant to the module terminals such as the positions, types (whether each terminal is an input terminal or an output terminal) and so forth of the module terminals can be obtained as the parameters of the modules. Therefore, in order to execute the floorplan, the DBMS 12 extracts the information of the terminal positions and so forth as the parameters of the I/O ports of the modules of the aforementioned multipliers, adders and controller in addition to the areas of the modules (step S14 in FIG. 1B), and these pieces of information are used. FIG. 10 shows a state in which wiring is being carried out according to the floorplan executed by means of these pieces of information.

After the execution of the aforementioned floorplan, the estimation unit 26 estimates the design features of the object of design on the basis of the execution result of the floorplan (step S18 in FIG. 1B) and decides whether or not the design result satisfies the aforementioned design constraints on the basis of the estimation result (step S20). As stated before, the design constraints are given as the conditions of the operating frequency, operation time and circuit scale, and therefore, the estimation unit 26 estimates the operating frequency, operation time and circuit scale of the object of design by means of the delay time and circuit scale relevant to the conditions of the design constraints among the design features of each module, or the constituent elements of the object of design at the behavior level. In this stage, in obtaining the delay time which serves as a base of estimation of the operating frequency and the operation time, wire lengths obtained by the floorplan are taken into consideration. By this operation, even at a higher abstraction level of design such as the behavior level, estimation of design with higher accuracy than in the prior art is enabled, improving the accuracy in deciding whether or not the design result satisfies the constraints. It is to be noted that in this example the design features of a module required for the estimation of the design are the circuit scale and the delay time of the module and they are obtained in the instance generating stage. However, when a design feature which cannot be obtained in the instance generating stage is required for the estimation of the design, the design feature estimation unit 60 in the DBMS 12 obtains the design features by referring to the feature estimation information of the module.

As stated before, the adder, multiplier and controller which are the constituent elements of the object of design have the circuit scales of 327 to 626 [gates], 2738 [gates] and 10 to 12 [gates], respectively. Therefore, in the case of design according to Approach 1 (see FIG. 8A), the lower bound of the circuit scale is 327×3+2738×4+10=11943 [gates], which does not satisfy the design constraint of the circuit scale of not greater than 5000 [gates]. The estimation result of the design at the behavior level as described above is displayed on the display unit 20, and the designer changes the design at the behavior level by referring to this. That is, in the case of the present example, the designer changes the implementation approach of the object of design to Approach 2, draws a data flow graph as shown in FIG. 8B and describes this data flow graph by the specified HDL. By these operations, new description data of the object of design at the behavior level is generated according to Approach 2 (step S22 in FIG. 1B).

According to the design represented by the new description data, as apparent from FIG. 8B, one product-sum operation unit, one register and a controller are necessary. Therefore, in making the new description at the behavior level, instances of the modules of the product-sum operation unit, register and controller are generated by the DBMS 12, and the description of the object of design is constituted by these instances. In this instance generating stage, bit widths of the product-sum operation unit and the register are given as parameter values to the DBMS 12. Further, in this stage, the DBMS 12 can obtain the following information as the design features of the product-sum operation unit, register and controller.

(1) Product-sum operation unit:
   Circuit scale: 3065 to 3364 [gates]
   Delay time: 61.1 to 92.2 [ns]
(2) Register: Circuit scale: 338 [gates]
   Delay time: 4.9 [ns]
(3) Controller: Circuit scale: 50 to 60 [gates]
   Delay time of 0.7 [ns]

Figure 9B:
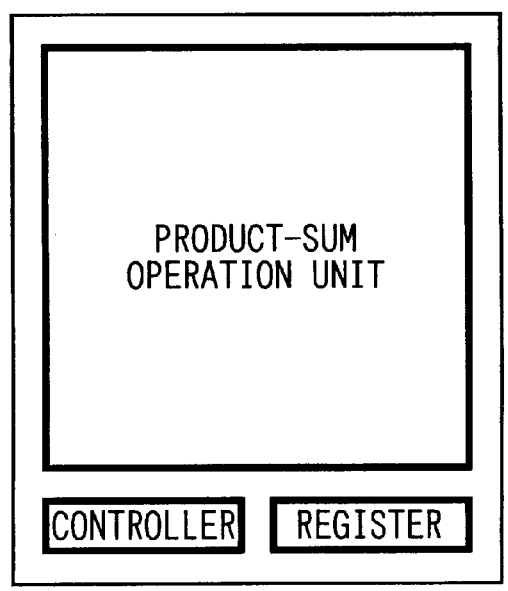

On the new description data generated as described above, the validation and floorplan are executed similar to the case of the original description data (the case of Approach 1) (see FIG. 1A(*a*) and step S16 in FIG. 1B). In this case, the result of the floorplan is as shown in FIG. 9B (note that the wires between the modules are not shown).

Next, the design features of the object of design are estimated by the estimation unit 26 on the basis of the floorplan result (step S18 in FIG. 1B), and it is decided whether or not the design result satisfies the aforementioned design constraints on the basis of the estimation result (step S20). In this stage, the operating frequency, operation time and circuit scale of the object of design are estimated by means of the delay time and circuit scale relevant to the conditions of the design constraints among the design features of each module, or the constituent elements of the object of design at the behavior level, with the wire lengths obtained by the floorplan taken into consideration.

As stated before, the product-sum operation unit, register and controller which are the constituent elements of the object of design have the circuit scales of 3065 to 3364 [gates], 338 [gates], and 50 to 60 [gates], respectively. Therefore, in the case of the design according to Approach 2 (see FIG. 8B), the lower bound of the circuit scale is 3065+338+50=3453 [gates], and the upper bound is 3364+ 338+60=3762 [gates]. Therefore, the circuit scale of the object of design is 3453 to 3762 [gates], which satisfies the design constraint of the circuit scale of not greater than 5000 [gates]. The operation time of the object of design is estimated by means of the delay times of the product-sum operation unit and the register which are the constituent elements, with a wiring delay based on the wire lengths obtained through the floorplan taken into consideration. Assuming now that the delay time due to the wiring is 1.05 [ns], the delay times of the product-sum operation unit, register and controller are 61.1 to 92.2 [ns], 4.9 [ns] and 0.7 [ns], respectively, as stated before, and then a delay time of not greater than 100 [ns] results even when the delay time of the wiring is added to the sum of the delay time of the constituent elements of the object of design. Then, according to Approach 2, more than four times of pass through the product-sum operation unit and the register are required to obtain one operation result (see FIG. 8B). However, since a time of not greater than 100 [ns] is required for one-time pass, the operation time in the case of the design according to Approach 2 becomes not greater than 400 [ns], which satisfies the design constraint. Furthermore, it also satisfies the design constraint of the operating frequency of not lower than 10 [MHz] (the cycles of not greater than 100 [ns]).

When the design constraints at the behavior level are satisfied as described above, it is decided that no further correction of the description data at the behavior level is required (step S20 in FIG. 1B). On the basis of this decision, the synthesis unit 28 generates description data at the RT level from the description data at the behavior level by means of the behavioral synthesis tool (step S24 in FIG. 1B). In this stage, the DBMS 12 generates the instances at the RT level of the modules of the product-sum operation unit, register and controller which are the constituent elements of the object of design, and the object of design is described by using those instances. As already mentioned, in the FHM-DB are described procedure for instance generation and so forth at every abstraction level for each registered module (see FIG. 4). Therefore, by referring to the FHM-DB by the DBMS 12 in generating description data at the RT level from the description data at the behavior level, the description at the RT level corresponding to each module at the behavior level can be easily obtained. It is to be noted that a new parameter (e.g., a parameter designating the algorithm of the adder in the product-sum operation unit) is required in generating the aforementioned instance at the RT level. The parameter is given by the designer. Alternatively, the algorithm may be automatically selected by the behavioral synthesis tool.

<3.2 RT level (see FIG. 1A (b))>

Figure 11A:
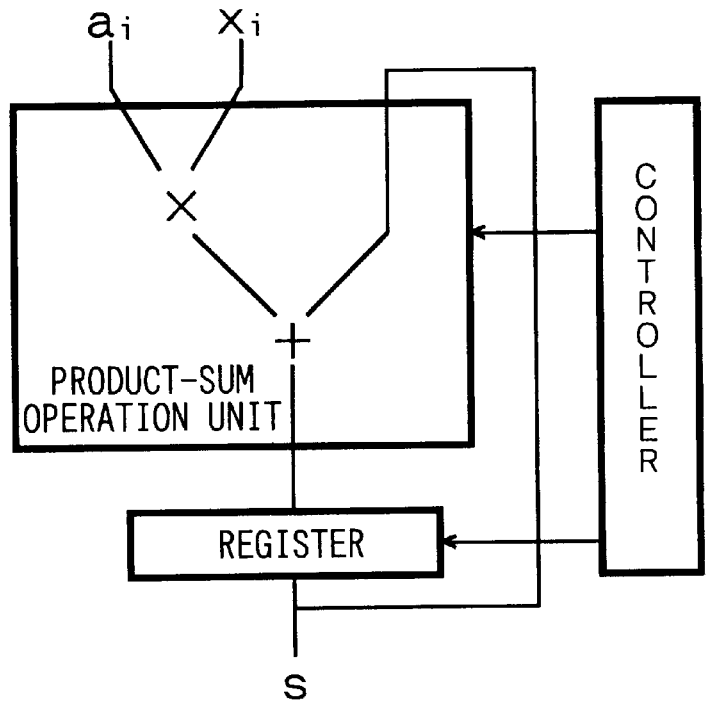
FIGS. 11A and 11B are block diagrams showing the constructions of the object of design at the RT level in the above embodiment.
Figure 11B:
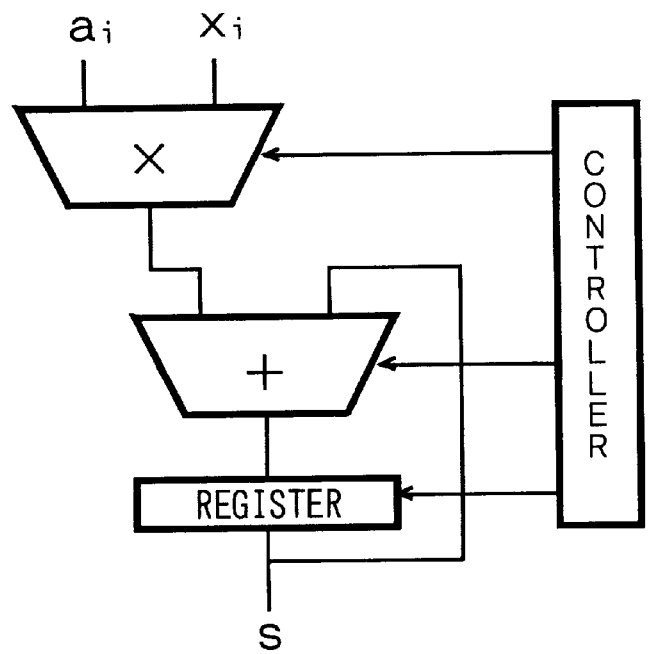

When the description data at the RT level is generated as described above, the design result at the RT level is obtained. FIG. 11A is a block diagram showing this design result, where the product-sum operation unit has a hierarchical structure. When this hierarchical structure is developed, the design result becomes as shown in FIG. 11B. In this case, the design features of the module of the product-sum operation unit which is the constituent element of the object of design can be obtained by giving the bit width and the algorithm of the adder as parameters to the DBMS 12. Assuming that a "ripple carry" is designated as a parameter denoting an adder algorithm which is a parameter given in the instance gen-erating stage of the product-sum operation unit at the RT level in the aforementioned behavior synthesis stage, then the following information is obtained as design features of the product-sum operation unit.

Circuit scale: 3065 [gates]

Delay time: 92.2 [ns]

When the description data at the RT level is obtained as described above, then the design result at the RT level is validated by the validation unit 22 by means of this description data (step S12 in FIG. 1B). In this stage, the validation unit 22 executes functional validation by subjecting the description data at the RT level to the simulator or verifier a t the RT level.

After the above validation , a floorplan at the RT level is executed by the floorplanner 24 (step S16 in FIG. 1B). That is, the floorplanner 24 executes the placement of the modules (i.e., instances) of the multiplier, adder (whose algorithm is "ripple carry") and register which are the constituent elements of the object of design shown in FIG. 11B implemented at the RT level, and wiring between the modules, on the basis of the description data at the RT level. In this stage, the DBMS 12 extracts information of the terminal positions which serve as parameters of the I/O ports of the modules and so forth in addition to the areas of the modules (step S14 in FIG. 1B), and these pieces of information are used for the floorplan.

After the execution of the above-mentioned floorplan, the estimation unit 26 estimates the design features of the object of design on the basis of the execution result of the floorplan to decide whether or not a design change at the RT level is required (step S18 in FIG. 1B). In this stage, the operating frequency, operation time and circuit scale of the object of design are estimated by means of the delay time and circuit scale relevant to the conditions of the design constraints among the design features of the modules, or the constituent elements of the object of design at the RT level, with the wire lengths obtained through the floorplan taken into consideration. However, the fact that the design constraints are satisfied have been already discovered in the estimation of the design at the behavior level, and therefore, the operating frequency, operation time and circuit scale of the object of design estimated at the RT level satisfy the design constraints. These estimation values are displayed as estimation results at the RT level on the display unit 20, and the designer decides whether or not a design change at the RT level is required by referring to them (step S20 in FIG. 1B).

In this example, in comparison between the design constraints and the estimation results, the operation time and so forth are considered to have a small margin with respect to the design constraints. Therefore, the designer decides that a design change at the RT level is required and then corrects the description data at the RT level in an attempt at improving the performance (step S22 in FIG. 1B). In concrete, the designer designates a "carry look-ahead" as an adder algorithm to generate an instance for the product-sum operation unit and then corrects the description data at the RT level so that this instance becomes a constituent element of the object of design. Then, in this instance generating stage, the following information is obtained as design features of the product-sum operation unit from the DBMS 12.

Circuit scale: 3364 [gates]

Delay time: 61.1 [ns]

In regard to the new description data at the RT level obtained as described above, the construction after the hierarchical development becomes as shown in FIG. 11B. It is to be noted that the area of the adder and so forth are different from those of the description data at the RT level prior to the change. The new description data at the RT level is similarly subjected to the validation and floorplan (FIG. 1A(b)).

Next, the estimation unit 26 estimates the design features of the object of design on the basis of this floorplan result, and it is decided whether or not a further design change at the RT level is required (step S20 in FIG. 1B). In this stage, the design features of the object of design as well as the operating frequency and operation time of the object of design estimated on the design features are displayed on the display unit 20, and the designer decides whether or not a design change at the RT level is required by referring to them. At this point of time, the design constraints are satisfied and the performance is improved (refer to the delay time of the aforementioned product-sum operation unit), and therefore, it is decided that no design change at the RT level is required.

Figure 12:
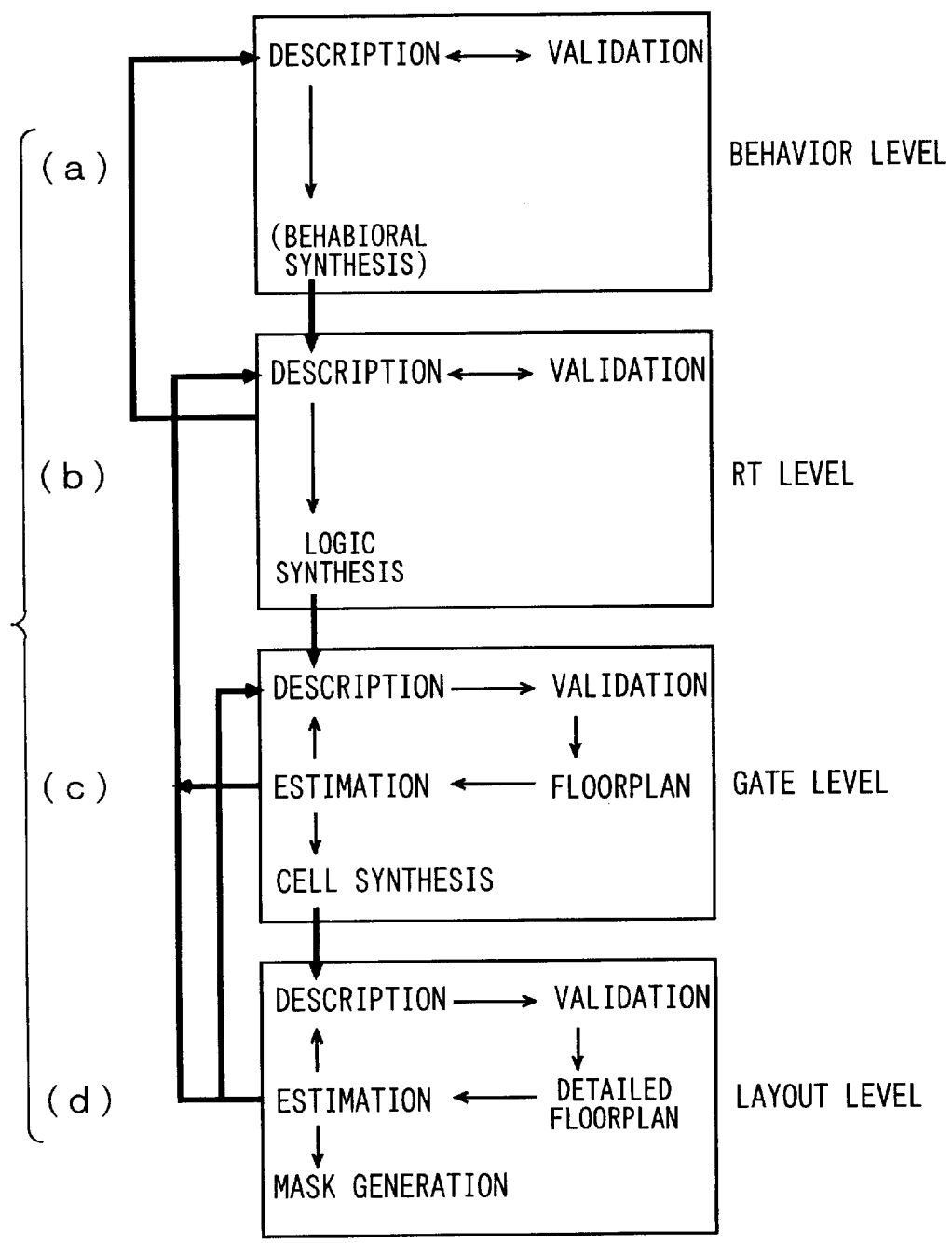
FIG. 12 is a flowchart showing an integrated circuit design method according to the prior art.

On the basis of this decision, the synthesis unit 28 generates description data (net list) at the gate level from the description data at the RT level by means of a logical synthesis tool (step S24 in FIG. 1B). The subsequent design procedure, i.e., the design procedure at the gate level and the layout level is similar to that of the prior art design method (FIG. 12). However, it is secured that the design result satisfies the design constraints at the higher level (behavior level) according to the design method shown in FIG. 1A, and therefore, the design results at the lower levels surely satisfy the design constraints. As a result, there is required no return from the lower level to the higher level for a design change. This arrangement prevents a time required for the completion of the design from being prolonged and becomes able to cope with an integrated circuit design in the deep submicron era.

MODIFICATION EXAMPLE

According to the aforementioned design method shown in FIG. 1A, while it is decided that the design constraints are not satisfied by the estimation of the design at the behavior level, the steps of correcting the description data, validating the data, executing the floorplan and estimating the same are repeated at the behavior level. However, the design features can be obtained in the form of a range as stated before (see the expressions (2) through (5)). Therefore, even when the design constraints are not satisfied in the design at the higher level, it is possible that the design constraints be finally satisfied depending on the manner of design at the lower level so long as a portion satisfying the design constraints is included in the range of the design features. Therefore, when a portion satisfying the design constraints is included in the range of the design features, it is acceptable to adopt a arrangement in which a shift is made through a synthesis step to the design at the lower level. In the case of this arrangement, it is possible that a return from the lower level to the higher level for a design change be required, and therefore, this is on condition that the designer takes a risk in the shift to the lower level without satisfying the design constraints.

Although the design constraints are given as the conditions of the hardware cost (circuit scale) and the performance (operation time and operating frequency) in the above-mentioned example of design, it is often the case where the condition of the power consumption is included in the design constraints. In this case, the power consumption of the object of design is estimated at the estimation step at each design level. According to the present design method, even at the higher level of the behavior level or the RT level, the wiring capacitance between the modules can be taken into consideration on the basis of the result of the floorplan in the preceding step, in this estimation. With this arrangement, the power consumption of the object of design can be accurately estimated even at the higher level, and this eliminates the requirement of the return from the lower level to the higher level for a design change even when the condition of the power consumption is included in the design constraints.

What is claimed is:

1. An estimation method of an integrated circuit design on a top-down approach for designing at a behavior level an integrated circuit which is an object of design with specified constraints thereby generating a behavior level description data of the object of design and successively generating a description data corresponding to lower levels of abstraction from said behavior level description data, said method comprising the steps of:

preparing a database wherein a variety of modules capable of being used as constituent elements of the object of design are registered as parametrized models, and instance generating information representing a procedure for generating an instance which is a module implemented by giving a parameter value to each of the various modules and feature estimation information representing a method of estimating specified design features representing the features of the various modules are stored every abstraction level of said design on the top-down approach for the various modules;

generating a behavior level description data by generating instances by means of the instance generating information and the parameter values of the modules registered in said database and by describing at the behavior level the object of design with said instances used as constituent elements;

extracting from said database the feature estimation information of the modules described as the constituent elements of the object of design in said behavior level description data and estimating design features of the modules by means of said feature estimation information and said parameter values of the modules;

executing a floorplan corresponding to said behavior level description data on the basis of the design features of said modules; and estimating design features representing features of the design at the behavior level corresponding to said behavior level description data on the basis of a result of said floorplan.

2. An estimation method as claimed in claim 1, wherein a module having a hierarchical structure is registered in said database, and a floorplan is executed on the basis of information of interconnection between submodules constituting said module and design features of the module having said hierarchical structure are estimated by means of a result of said floorplan and design features of the submodules in estimating the design features of said module having said hierarchical structure.

3. An estimation method of an integrated circuit design on a top-down approach for designing at a behavior level an integrated circuit which is an object of design with specified constraints thereby generating a behavior level description data of the object of design and successively generating description data corresponding to lower levels of abstraction from said behavior level description data, said method comprising the steps of:

preparing a database wherein a variety of modules capable of being used as constituent elements of the object of design are registered as parametrized models, and instance generating information representing a procedure for generating an instance which is a module implemented by giving a parameter value to each of the various modules and feature estimation information representing a method of estimating specified design features representing the features of the various modules are stored every abstraction level of said design on the top-down approach for the various modules;

generating a RTL description data which is a description data of the object of design at a register transfer level from said behavior level description data by means of the instance generating information at the register transfer level stored in said database;

extracting from said database the feature estimation information of the modules described as the constituent elements of the object of design in said RTL description data and estimating design features of the modules by means of said feature estimation information and said parameter values of the modules;

executing a floorplan corresponding to said RTL description data on the basis of the design features of said modules; and estimating design features representing features of the design at the register transfer level corresponding to said RTL description data on the basis of a result of said floorplan.

4. An integrated circuit design method on a top-down approach for designing at a behavior level an integrated circuit which is an object of design with specified constraints thereby generating a behavior level description data of the object of design and successively generating a description data corresponding to lower levels of abstraction from said behavior level description data, said method comprising:

a first step of preparing a database wherein a variety of modules capable of being used as constituent elements of the object of design are registered as parametrized models, and instance generating information representing a procedure for generating an instance which is a module implemented by giving a parameter value to each of the various modules and feature estimation information representing a method of estimating specified design features representing the features of the various modules are stored every abstraction level of said design on the top-down approach for the various modules;

a second step of generating a behavior level description data by generating instances by means of the instance generating information and the parameter values of the modules registered in said database and by describing at the behavior level the object of design with said instances used as constituent elements;

a third step of extracting from said database the feature estimation information of the modules described as the constituent elements of the object of design in said behavior level description data and estimating design features of the modules by means of said feature estimation information and said parameter values of the modules;

a fourth step of executing a floorplan corresponding to said behavior level description data on the basis of the design features estimated in the third step;

a fifth step of estimating design features representing features of the design at the behavior level represented by said behavior level description data on the basis of an result of the floorplan in the fourth step;

a sixth step of deciding whether or not a design change at the behavior level is required on the basis of the design features estimated in the fifth step and the constraints of the object of design;

a seventh step of obtaining a new behavior level description data by changing said behavior level description data when it is decided that a design change at the behavior level is required in the sixth step; and an eighth step of generating an RTL description data which is a description data of the object of design at a register transfer level from said behavior level description data which is an object of the decision in the sixth step by means of said instance generating information at the register transfer level stored in said database when it is decided that no design change at the behavior level is required in the sixth step, whereby the processes of obtaining a new behavior level description data in the seventh step and successively executing the third step, fourth step, fifth step and sixth step on the new behavior level description data are repeated while it is decided that a design change at the behavior level is required in the sixth step.

5. An integrated circuit design method as claimed in claim 4, wherein it is decided in said sixth step whether or not a design change at the behavior level is required depending on whether or not the design features estimated in said fifth step satisfy the design constraints of the object of design.

6. An integrated circuit design method as claimed in claim 4, wherein a module having a hierarchical structure is registered in said database, and a floorplan is executed on the basis of information of interconnection between submodules constituting said module and design features of the module having said hierarchical structure are estimated by means of a result of said floorplan and design features of the submodules in estimating the design features of said module having said hierarchical structure.

7. An integrated circuit design method as claimed in claim 4, further comprising:

a ninth step of extracting the feature estimation information of the modules described as the constituent elements of the object of design in said RTL description data and estimating the design features of the modules by means of said feature estimation information and said parameter values of the modules;

a tenth step of executing a floorplan corresponding to said RTL description data on the basis of the design features estimated in the ninth step;

a eleventh step of estimating design features representing the design features at the register transfer level represented by said RTL description data on the basis of a result of the floorplan in the tenth step;

a twelfth step of deciding whether or not a design change at the register transfer level is required on the basis of the design features estimated in the eleventh step and the constraints of the object of design;

a thirteenth step of obtaining a new RTL description data of the object of design by changing said RTL description data when it is decided that a design change at the register transfer level is required in the twelfth step; and a fourteenth step of generating a net list which is a description data of the object of design at a gate level from said RTL description data which is an object of the decision in the twelfth step by means of said instance generating information at the gate level stored in said database when it is decided that no design change at the register transfer level is required in the twelfth step, whereby the processes of obtaining the new RTL description in the thirteenth step and successively executing the ninth step, tenth step, eleventh step and twelfth step on the new RTL description data are repeated while it is decided that a design change at the register transfer level is required in the twelfth step.

8. An integrated circuit design method as claimed in claim 7, wherein it is decided in said twelfth step whether or not a design change at the register transfer level is required depending on whether or not the design features estimated in said eleventh step are higher than a specified level.

9. An integrated circuit design method as claimed in claim 7, wherein the design features estimated in said third, fifth, ninth and eleventh steps include values representing an area and a performance or a range of the values.

10. An integrated circuit design method as claimed in claim 9, wherein the design features estimated in said third and ninth steps include information representing positions and types of terminals of the modules which are the constituent elements of the object of design, and the floorplan is executed in said fourth and tenth steps on the basis of the information representing the area and the positions and types of the terminals represented by the design features of the modules which are the constituent elements of the object of design.

11. An integrated circuit design method as claimed in claim 10, wherein the design features estimated in said third, fifth, ninth and eleventh steps include a value representing a power consumption or a range of the value.

12. An integrated circuit design method as claimed in claim 9, wherein the design features estimated in said third, fifth, ninth and eleventh steps include a value representing a power consumption or a range of the value.

13. A database apparatus for use in executing a design on a top-down approach for designing at a behavior level an integrated circuit which is an object of design with specified constraints thereby generating a behavior level description data of the object of design and successively generating description data at lower levels of abstraction from said behavior level description data, said apparatus comprising:

a storage means for storing therein a database in which a variety of modules capable of being used as constituent elements of the object of design are registered as parametrized models, and instance generating information representing a procedure for generating an instance which is a module implemented by giving a parameter value to each of the various modules and feature estimation information representing a method of estimating specified design features representing the features of the various modules are stored every abstraction level of said design on the top-down approach for the various modules;

an instance generating means for extracting an instance generating information of any of modules registered at an abstraction level in said database and for generating an instance for said module by means of said instance generating information and parameter values of said module, when said module and said abstraction level are designated and said parameter values are given; and a module feature estimating means for extracting a feature estimation information of any of modules registered at an abstraction level in said database and for estimating design features for said module by means of said feature estimation information and parameter values of said module, when said module and said abstraction level are designated and said parameter values are given.

14. An integrated circuit design support apparatus operated by a designer for executing a design on a top-down approach for designing at a behavior level an integrated circuit which is an object of design with specified constraints thereby generating a behavior level description data of the object of design and successively generating description data at lower levels of abstraction from said behavior level description data, said design support apparatus comprising:

said database apparatus claimed in claim 13;

a description data generating and editing means for generating and editing said behavior level description data by generating instances by means of said instance generating information and by describing at the behavior level the object of design with said instances used as constituent elements on the basis of an input operation conducted by said designer;

a floorplan executing means for obtaining design features of modules described as constituent elements of the object of design in said behavior level description data by said module feature estimating means by means of parameter values of the modules and executing a floorplan corresponding to said behavior level description data on the basis of said design features;

a design feature estimating means for estimating design features representing features of the design at the behavior level corresponding to said behavior level description data on the basis of a result of said floorplan; and a behavioral synthesis means for generating an RTL description data describing the object of design at a register transfer level from said behavior level description data describing the object of design at the behavior level by means of said instance generating information at the register transfer level stored in said database.

15. An integrated circuit design support apparatus as claimed in claim 14, wherein said description data generating and editing means also edits said RTL description data generated by said behavioral synthesis means on the basis of an input operation conducted by said designer, said floorplan executing means acquires design features by said module feature estimating means also in connection with said RTL description data and executes the floorplan corresponding to said RTL description data on the basis of the information of said design features, and said design feature estimating means also estimates design features representing features of the design at the register transfer level on the basis of a result of the floorplan corresponding to said RTL description data.

16. An integrated circuit design support apparatus as claimed in claim 14 or 15, wherein said design features estimated by said module feature estimating means and said design feature estimating means include values representing an area and a performance or a range of the values.

17. An integrated circuit design support apparatus as claimed in claim 16, wherein said design features estimated by said module feature estimating means and said design feature estimating means include a value representing a power consumption or a range of the value.

18. An integrated circuit design support apparatus as claimed in claim 16, wherein said design features estimated by said module feature estimating means include information representing positions and types of terminals of the modules which are the constituent elements of the object of design, and said floorplan executing means executes the floorplan on the basis of said area and said information representing positions and types of terminals which are represented by the design features of the modules which are the constituent elements of the object of design.

19. An integrated circuit design support apparatus as claimed in claim 18, wherein said design features estimated by said module feature estimating means and said design feature estimating means include a value representing a power consumption or a range of the value.

\* \* \* \* \*